US006856138B2

(12) United States Patent
Bohley

(10) Patent No.: US 6,856,138 B2
(45) Date of Patent: Feb. 15, 2005

(54) TIME-DOMAIN REFLECTOMETER FOR TESTING TERMINATED NETWORK CABLE

(75) Inventor: Thomas K. Bohley, Colorado Springs, CO (US)

(73) Assignee: Fluke Corporation, Everett, WA (US)

( * ) Notice: Subject to any disclaimer, the term of this patent is extended or adjusted under 35 U.S.C. 154(b) by 398 days.

(21) Appl. No.: 10/202,368

(22) Filed: Jul. 23, 2002

(65) Prior Publication Data

US 2004/0017208 A1 Jan. 29, 2004

(51) Int. Cl.[7] .............................................. G01R 31/11
(52) U.S. Cl. ...................... 324/534; 324/532; 324/533
(58) Field of Search ................................ 324/532, 533, 324/534

(56) References Cited

U.S. PATENT DOCUMENTS

| | | | | |
|---|---|---|---|---|
| 5,461,318 A | * | 10/1995 | Borchert et al. ............ 324/533 |
| 5,586,054 A | | 12/1996 | Jensen et al. | |
| 6,138,080 A | * | 10/2000 | Richardson ................... 702/79 |
| 6,233,613 B1 | * | 5/2001 | Walker et al. ............... 709/224 |
| 6,285,744 B1 | * | 9/2001 | Nero et al. ............... 379/27.01 |
| 6,324,168 B1 | * | 11/2001 | Richardson ................. 370/254 |
| 6,397,159 B1 | * | 5/2002 | Richardson ................... 702/79 |
| 6,531,879 B1 | * | 3/2003 | Nero, Jr. ..................... 324/534 |
| 6,532,215 B1 | * | 3/2003 | Muntz ........................ 370/242 |
| 6,795,402 B1 | * | 9/2004 | Richardson et al. ......... 370/241 |

* cited by examiner

Primary Examiner—Charles H. Nolan, Jr.
(74) Attorney, Agent, or Firm—Richard A. Koske

(57) ABSTRACT

A time domain reflectometer having a first impedance when in a first test mode and a second impedance when in a second test mode. The first impedance is substantially the same as the nominal characteristic impedance of a network link cable not connected to a network and the second impedance is substantially different from the impedance of a network link cable that is terminated into a network. A method for measuring the length of a terminated network cable includes the steps of determining that the network cable is terminated at a network, selecting a test mode suitable for testing the terminated network cable, and performing time domain reflectometry testing on the terminated network cable.

7 Claims, 4 Drawing Sheets

TIME-DOMAIN REFLECTOMETER FOR TESTING TERMINATED NETWORK CABLE

BACKGROUND OF THE INVENTION

This invention relates generally to time-domain reflectometry and more particularly to a time-domain reflectometry apparatus and method for testing a terminated network cable.

In a network environment, such as Ethernet systems, devices are connected to the network by cables, commonly referred to as link cables. FIG. 1 illustrates a portion of a network where device 18, such as a computer or printer, is connected at node 16 to one end of link cable 14. The other end of link cable 14 is connected at node 12 to the network, which in FIG. 1 is represented by cable 10.

Technicians troubleshooting networks need to test, among other network elements, the various link cables in the system. To verify that link cables meet specifications, technicians use cable test instruments, which have the ability to test, among other parameters, cable length. In an Ethernet system, for example, the length of a link cable is limited by system standards to a maximum of 100 meters. Cable test instruments typically employ time domain reflectometry (TDR) to measure the length of link cables. In FIG. 1, cable tester 20 is connected to link cable 14 at node 16. From this location, cable tester 20 may perform TDR testing on link cable 14.

FIG. 2 illustrates a typical TDR circuit 22 such as may be utilized in tester 20 and found in the prior art. TDR circuit 22 is coupled to terminals 24, 26 of instrument 20. A link cable 28, which is to be tested, is connected to terminals 24, 26. Cable 28 is illustrated as a twisted pair, that is, a pair of wires 28a, 28b terminated at one end to terminals 24, 26. Link cable 28 has a characteristic impedance, $Z_0$.

TDR circuit 22 includes voltage sources V1 and V2 coupled between ground and resistors R1 and R2, respectively. The other end of R1 is connected to terminal 24 and the other end of R2 is connected to terminal 26. As depicted in FIG. 2, V1 supplies a positive voltage pulse through R1 to cable 28 and V2 supplies a negative pulse through R2 to cable 28.

The nominal value of $Z_0$ is typically 100 ohms. Values of R1 and R2 are typically selected to be 50 ohms. In this way the impedance of the TDR circuit 22 is matched to the characteristic impedance $Z_0$ of link cable 28.

Also connected to terminals 24, 26, is amplifier 30, with its positive input connected to terminal 24 and negative input connected to terminal 26. The output signal of amplifier 30 is illustrated by waveform 70 depicted in FIG. 3.

During TDR testing of cable 28, voltages V1, V2 supply a pulse signal to link cable 28. A fault anywhere along cable 28 results in a reflected waveform that will be detected by TDR circuit 22. The reflected signal is applied to amplifier 30 whose output generates waveform 70 in FIG. 2.

In many circumstances, it is desirable to be able to test link cables without disconnecting them from the network. This saves technicians time and also reduces the chance of error when reconnecting the link cable. Unfortunately, prior art cable testers utilizing TDR circuits of the type depicted in FIG. 2 and described above, do not provide clear and simple testing solutions for cables that are connected to a network. This shortcoming of prior art TDR test methods is due to the matching of impedances of the instrument and the cable under test. While this fixed impedance matching is preferable in most testing methodologies, it is actually detrimental when testing terminated network cables. It is well known that matching these impedances results in minimal power loss and, therefore, produces the strongest signals during test by minimizing return signals. However, when the cable under test is terminated into a network, the mismatched impedance of the connection results in a small or non-existent return signal, which in turn reduces the effectiveness of the TDR test.

This problem is further illustrated by waveform 70 depicted in FIG. 3, which represents the reflected signal for a link cable that is tested while connected into a network. The portion A of the waveform illustrates the reflected signal identifying of the end of the link cable. As is clear from this portion of FIG. 3, the TDR reflection indicating the end of the link cable, and hence the length of the cable, is difficult to detect. It would be very difficult for a cable test technician to extract information from the reflected signal of FIG. 3 if it were to appear on a display in a hand held instrument of the sort typically used in the field.

Accordingly, there is a need to provide an apparatus and method for TDR testing of a link cable while it is connected to the network. The apparatus and method should be simple and easily embodied into handheld test instruments so that cable test technicians may readily interpret the results provided by the instrument. The present invention is directed to an apparatus and method designed to achieve these results.

SUMMARY OF THE INVENTION

In accordance with the present invention, a time domain reflectometer is provided having a first test mode and a second test mode in which the time domain reflectometer has a first impedance when in the first test mode and a second impedance when in the second test mode.

In accordance with further aspects of the present invention, the first impedance is substantially the same as the nominal characteristic impedance of a network link cable, and the second impedance is greater than the first impedance.

In accordance with yet further aspects of the present invention, the second impedance is greater than the resulting impedance of a network link cable that is terminated into a network.

In accordance with the present invention, a method for measuring the length of a terminated network link cable includes the steps of: determining that the network link cable is connected to a network, selecting a test mode suitable for testing the terminated network link cable, performing time domain reflectometry testing on the terminated network link cable.

In accordance with further aspects of the present invention, the method further includes the steps of: determining that the network link cable is disconnected from a network, selecting a test mode suitable for testing the disconnected network link cable, performing time domain reflectometry testing on the disconnected network link cable.

In accordance with sill further aspects of the present invention, the method further includes the step of selecting between the test mode suitable for testing the terminated network link cable and the test mode suitable for testing the disconnected network link cable.

As will be appreciated from the foregoing summary, the present invention provides a time domain reflectometer for testing a terminated network link cable and a method for accomplishing the same.

BRIEF DESCRIPTION OF THE DRAWINGS

The foregoing aspects and many of the attendant advantages of this invention will become better understood by reference to the following detailed description, when taken in conjunction with the accompanying drawings, wherein.

DETAILED DESCRIPTION OF THE PREFERRED EMBODIMENT

Figure 4:
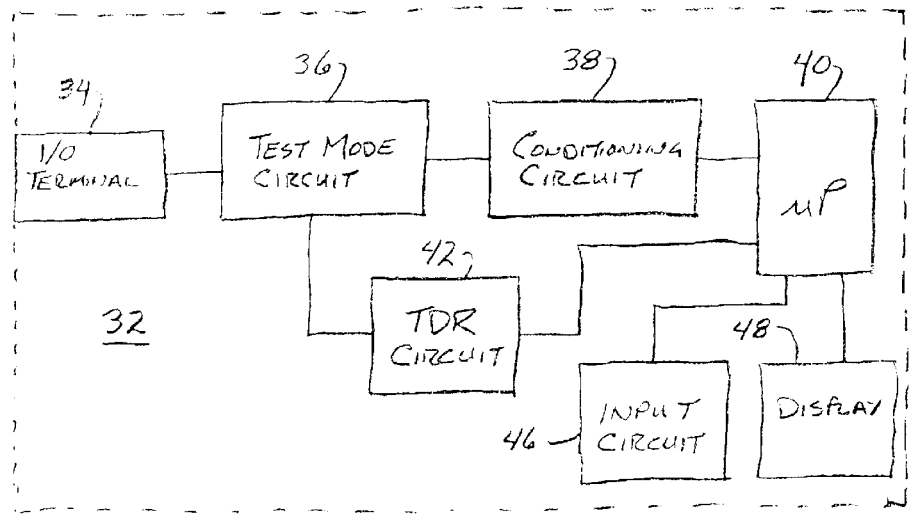
FIG. 4 is a block diagram of a cable test instrument suitable for employing a TDR circuit according to the present invention.

Turning now to FIG. 4 there is illustrated a block diagram of a cable tester 32 suitable for performing TDR testing. Cable testers, and their general operation, are well known by persons in the area of network testing and analysis. Accordingly, cable tester 32 is not described in detail, but rather is discussed in general terms to better allow the understanding of the present invention.

Cable tester 32 includes an input/output terminal 34 for coupling to the link cable which is to be tested. Typically, the instrument is not directly connected to the link cable, but is instead coupled to the cable by a test cable that runs from terminal 34 to the link cable. Terminal 34 is coupled to test mode circuit 36 which configures the tester for a particular test. Conditioning circuit 38 is connected to test mode circuit 36 and processor 40, and performs, among other tasks, conditioning, filtering and organizing of the signal and data passing between processor 40 and test mode circuit 36. Display 48 and input circuit 46 are coupled to processor 40. Display 48 may be, for example, an LCD, and provides information to the instrument user, while input circuit 46 provides a means for the user to input instructions to the instrument 32. Input circuit 46 may be, for example, a keypad or touch screen, or other input device.

TDR circuit 42 is coupled to the test mode circuit 36 and processor 40 and is utilized when TDR testing is performed by tester 32. The operation of tester 32 is briefly discussed below to aid in further understanding the present invention.

When a technician desires to receive data from the network, appropriate instructions are supplied via input circuit 46 to processor 40, which cause test mode circuit 36 to be configured to receive data from the network through input terminal 34. When the technician desires to perform a TDR test, instruction are again provided to processor 40 via input circuit 46, this time causing test mode circuit 36 to be configured to couple TDR circuit 42 to terminal 34. In the latter configuration, TDR signals are applied to the cable under test and the reflected signal is detected by TDR circuit 42. The output of TDR circuit 42 is applied to processor 40 where appropriate operations are performed on the signal. An output associated with the reflected signal is typically presented on display 48 so that the technician may view and analyze results of the TDR test.

Figure 5:
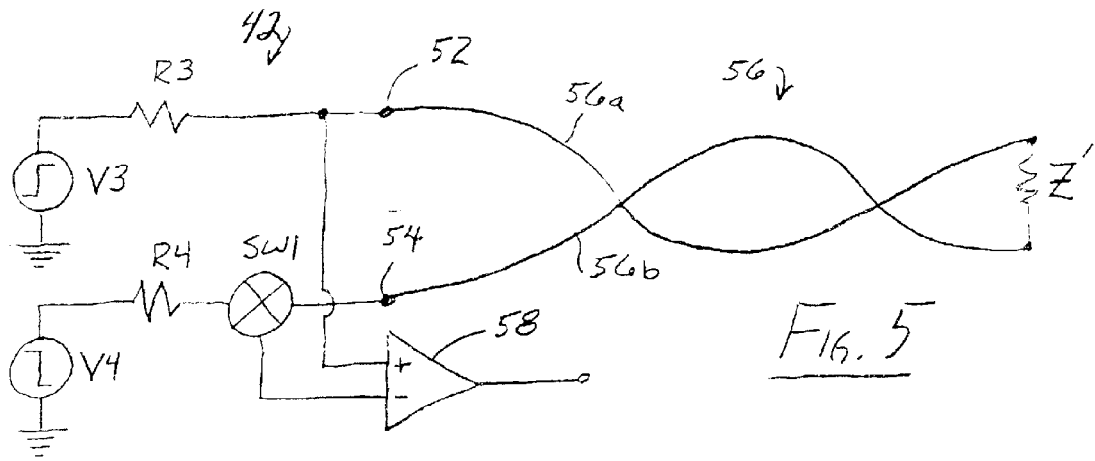
FIGS. 5, 5A and 5B are schematic diagrams of a TDR circuit according to the present invention; and, FIG. 6 illustrates a reflected waveform associated with the TDR circuit depicted in FIG. 5B.

Turning to FIG. 5, there is illustrated a TDR circuit 50 according to a preferred embodiment of the present invention. Voltage supplies V3, V4 are coupled to ground and to one end of resistors R3, R4, respectively. The other end of resistor R3 is connected to terminal 52. The other end of R4 is connected to switch SW1. Switch SW1 is coupled to terminal 54. Link cable 56 comprises twisted pair wires 56a, 56b, that are connected to terminals 52, 54 and has characteristic impedance Z'. Output amplifier 58 has its positive input connected to terminal 52 and its negative terminal connected to SW1.

Figure 5A:
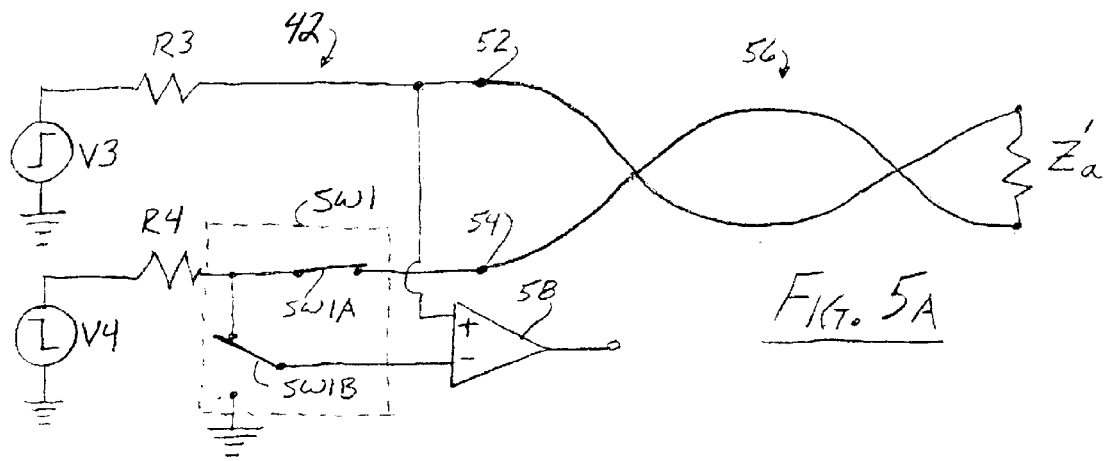

If link cable 56 is not terminated into (i.e., connected to) a network, the technician may select a TDR test mode such that TDR circuit 50 is configured as depicted in FIG. 5A. The technician may select this mode by providing appropriate instructions to tester 32, as discussed above with reference to FIG. 4. That is, instructions provided via input circuits 46 to processor 40 cause test mode circuit 36 to configure tester 32 so that TDR circuit 42 sends and receives TDR related signals to and from the link cable being tested.

Figure 1:
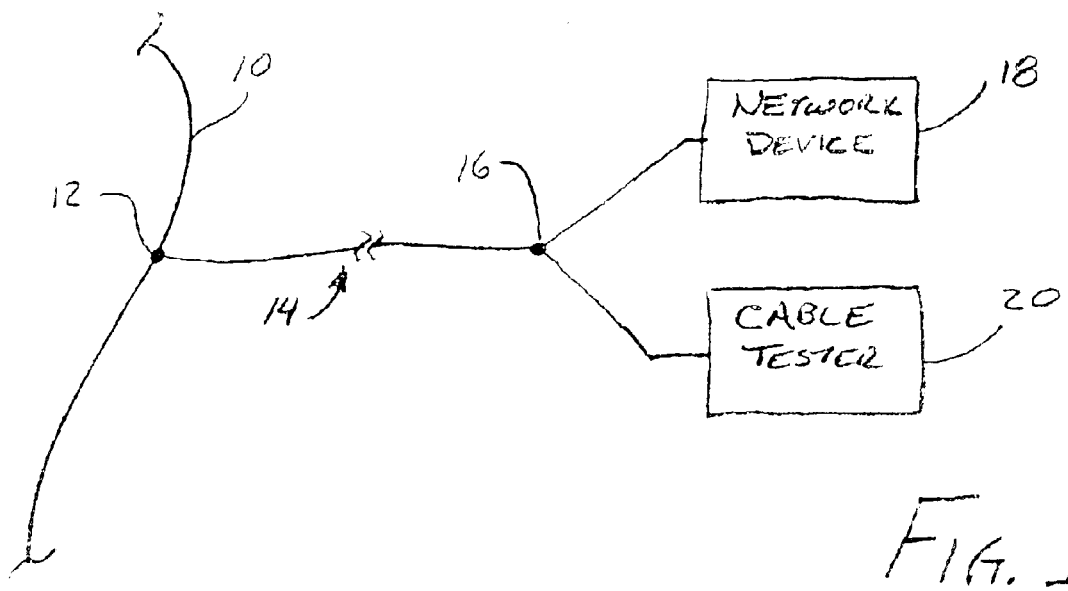
FIG. 1 illustrates a network environment in which time domain reflectometry (TDR) is commonly used.
Figure 2:
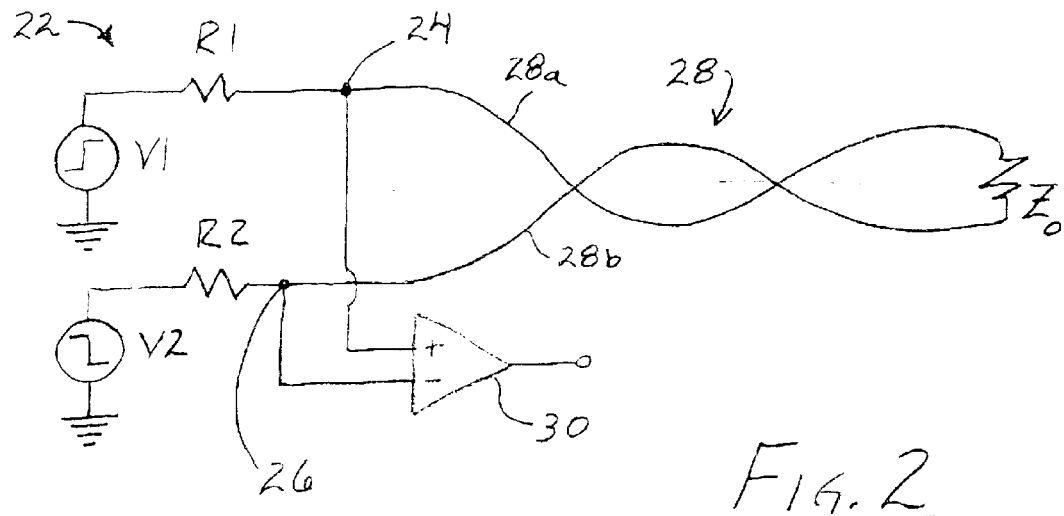
FIG. 2 is a schematic diagram of a typical TDR circuit found in the prior art.
Figure 3:
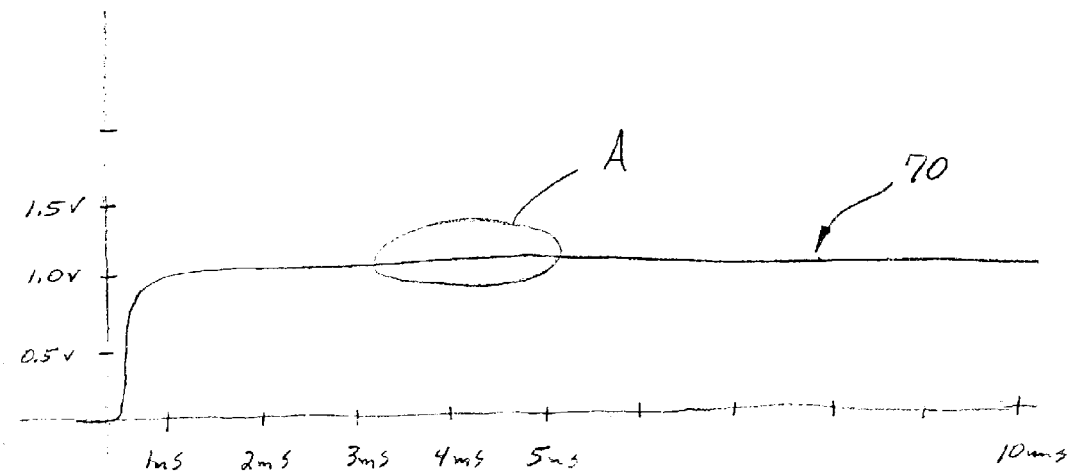
FIG. 3 illustrates a reflected waveform associated with the TDR circuit of FIG. 2.

The configuration of TDR circuit 42 shown in FIG. 5A is identical in operation to the circuit discussed above and depicted in FIG. 2. In FIG. 5A, SW1 is depicted as comprising two (2) switches SW1A, SW1B. Switch SW1A is connected between R4 and terminal 54. Switch SW1B is coupled at one end to either R4 or ground and at the other end to the negative input of amplifier 58. In this test mode, switch SW1A is closed and couples R4 to terminal 54. Switch SW1B couples the negative input of amplifier 58 to R4 and terminal 54. Thus, TDR circuit 50 in FIG. 5A is configured to operate in the same manner as TDR circuit 22, which was described above and is depicted in FIG. 2.

Figure 5B:
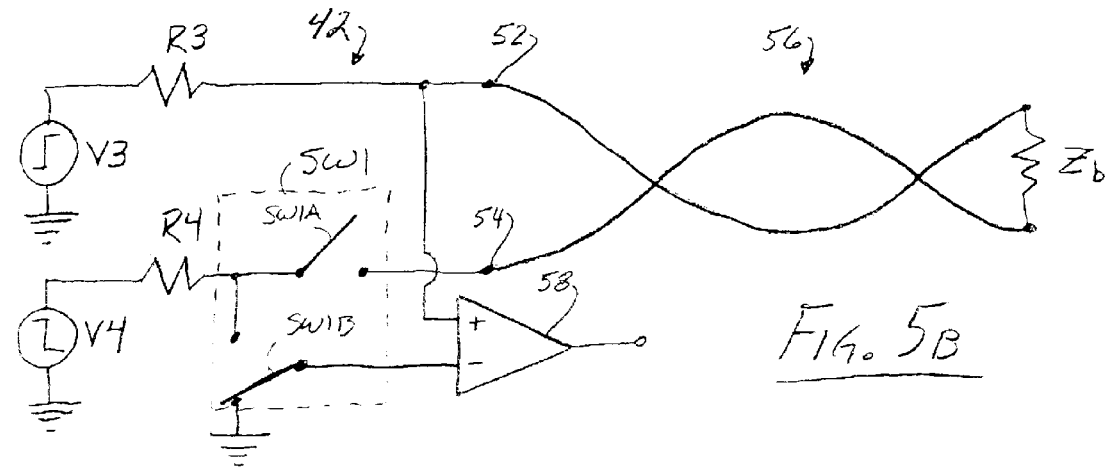

If, however, the link cable being tested is terminated into a network, then the technician may provide appropriate instructions to processor 40 and cause TDR circuit 42 to be configured as shown in FIG. 5B. In FIG. 5B, switch SW1A is open and switch SW1B connects the negative input of amplifier 58 to ground. Characteristic impedance Z'a is approximately equal to the cable impedance Z' (FIG. 5) due to the low impedance of the network connection. In this test mode, R4 is removed from the TDR test, which increases the impedance of TDR circuit 42 so that it is mismatched with the characteristic impedance Z'a of the link cable/network combination.

Figure 6:
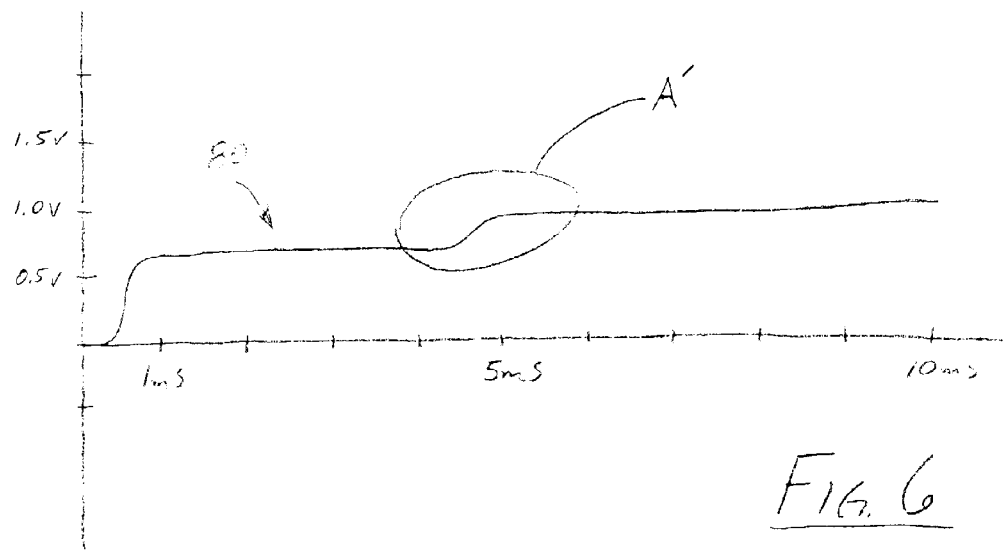

In accordance with one particular embodiment, R3 and R4 are each 50 ohms, and the characteristic impedance (Z') of link cable 56 is nominally 100 ohms. Thus, in the test mode depicted in FIG. 5B the impedance of TDR circuit 42 is 50 ohms at terminal 52 and infinite at terminal 54 and the impedance Z'a of the link cable/network combination is less than 100 ohms. As a result, the circuit configuration of FIG. 5b mismatches the impedances of TDR test circuit 42 and the cable/network load. The reflected TDR signal appearing at the output of amplifier 58 as a result of this impedance mismatch is illustrated by waveform 80 as depicted in FIG. 6.

In accordance with the preferred embodiment of the present invention, and as noted above, TDR circuit 42 in FIG. 5B has a higher impedance than the TDR circuit 42 depicted in FIG. 5A. As a result, the return pulse associated with FIG. 5B has a greater magnitude than the return pulse associated with FIG. 5A. Accordingly, the results of a TDR test represented by waveform 80 may be more readily detected by a technician when depicted on the display of a cable test instrument.

From the foregoing description, it may be seen that a TDR circuit for testing terminated network cables formed in accordance with the present invention incorporates many novel features and offers significant advantages over TDR test circuits and methods currently available. While the presently preferred embodiment of the invention has been illustrated and described, it is to be understood that within the scope of the appended claims, various changes can be made without departing from the spirit of the invention. For example, it is possible to have sensing circuitry in the test instrument that automatically configures the TDR circuit when a lower cable or load impedance is detected. Further, a variety of switches and methods for switching between test modes may be implemented. Therefore, the illustrated and described embodiment is to be considered as exemplary only and the invention itself should be evaluated only as defined in the claims that follow.

I claim as my invention:

1. A time domain reflectometer (TDR) comprising:
   (a) a TDR circuit having a first test mode and a second test mode;
   (b) a first impedance associated with the first test mode and a second impedance associated with the second test mode;
   (c) means for switching the TDR circuit between the first test mode and second test mode.

2. The time domain reflectometer of claim 1, wherein:
   (a) the first test mode is associated with testing a network cable that is disconnected from a network; and,
   (b) the first impedance is matched to a characteristic impedance of the disconnected network cable.

3. The time domain reflectometer of claim 2, wherein:
   (a) the second test mode is associated with testing a network cable that is connected to a network; and,
   (b) the second impedance is mismatched to an impedance of a combination of the network and the network cable connected to the network.

4. The time domain reflectometer of claim 3, wherein the second impedance is greater than the first impedance.

5. A method for applying time domain reflectometry testing of a network cable, comprising the steps of:
   (a) determining that the network cable is disconnected from a network;
   (b) selecting a first time domain reflectometry test mode suitable for testing the network cable disconnected to the network;
   (c) applying a first test signal to the network cable that is disconnected connected from the network; and,
   (d) receiving a reflected signal associated with the first test signal.

6. The method of claim 5, further comprising the steps of:
   (a) determining that the network cable is connected to the network;
   (b) selecting a second time domain reflectometry test mode suitable for testing the network cable connected to the network;
   (c) applying a second test signal to the network cable connected to the network; and,
   (d) receiving a reflected signal associated with the second test signal.

7. The method of claim 6 further comprising the step of switching between the first and second test modes.

* * * * *